United States Patent
Guldi et al.

(10) Patent No.: US 6,202,318 B1
(45) Date of Patent: Mar. 20, 2001

(54) SYSTEM FOR PROCESSING WAFERS AND CLEANING WAFER-HANDLING IMPLEMENTS

(75) Inventors: Richard L. Guldi, Dallas; Jimmie Brooks, Garland, both of TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/542,004

(22) Filed: Apr. 3, 2000

Related U.S. Application Data

(62) Division of application No. 08/989,957, filed on Dec. 12, 1997, now Pat. No. 6,096,100.
(60) Provisional application No. 60/032,894, filed on Dec. 13, 1996.

(51) Int. Cl.[7] .................................................. F26B 21/06
(52) U.S. Cl. .................................. 34/79; 34/202; 34/210; 34/215; 34/230; 134/21; 134/30; 134/37; 134/99.1; 134/902
(58) Field of Search .................................. 34/79, 84, 85, 34/202, 209, 210, 215, 218, 230; 134/21, 30, 34, 37, 34.1, 99.1, 902

(56) References Cited

U.S. PATENT DOCUMENTS

| | | | |
|---|---|---|---|
| 5,551,165 | * | 9/1996 | Turner et al. ........................ 34/404 |
| 5,698,040 | * | 12/1997 | Guldi et al. ......................... 134/1.3 |
| 5,711,821 | * | 1/1998 | Turner et al. ......................... 134/21 |
| 5,839,455 | * | 11/1998 | Turner et al. ......................... 134/57 |
| 5,991,965 | * | 11/1999 | Stroh et al. ........................ 15/310 |
| 6,055,742 | * | 5/2000 | Kim ...................................... 34/202 |
| 6,098,304 | * | 8/2000 | Manjkow et al. ...................... 34/79 |

* cited by examiner

*Primary Examiner*—Pamela Wilson
(74) *Attorney, Agent, or Firm*—Wade James Brady, III; Frederick J. Telecky, Jr.

(57) ABSTRACT

A system (10) for processing wafers and cleaning wafer cassettes (160, 260, 460) includes a work cell (12) having a plurality of processing stations (14) for processing wafers, and at least one processing/cleaning station (30, 130, 230, 430) for receiving and delivering wafers to and from a wafer cassette (160, 260, 460), a transfer mechanism (16) for moving the wafers between the plurality of processing stations (14) and the cleaning station (30). The cleaning station (30, 130, 230, 430) may have an exterior door (32, 132, 232, 432), an exhaust (34, 134, 234, 434), an interior door (40, 140, 240, 440), a plurality of gas nozzles (166, 266, 466) for delivering a sweeping gas over the wafer cassette (160, 260, 460). The cleaning process can also be done with a loaded cassette (160, 260, 460) that is unloaded before cleaning.

7 Claims, 4 Drawing Sheets

SYSTEM FOR PROCESSING WAFERS AND CLEANING WAFER-HANDLING IMPLEMENTS

CROSS REFERENCE TO PRIOR APPLICATIONS

This application is a division of Ser. No. 08/989,957, filed Dec. 12, 1997 now U.S. Pat. No. 6,096,100, which claims priority under 35 U.S.C. 119(e) based upon Provisional Application Ser. No. 60/032,894, filed Dec. 13, 1996.

TECHNICAL FIELD OF THE INVENTION

This invention relates generally to the field of semiconductor devices and semiconductor manufacturing methods, and more particularly to systems and methods for cleaning wafer-handling implements.

BACKGROUND OF THE INVENTION

The manufacture of semiconductor devices is a time consuming process that requires high levels of cleanliness throughout the many phases of the manufacturing process. Many steps of manufacturing are conducted in various classes of "clean rooms" having purified air flows to reduce the incidence of airborne particle contaminants to prescribed levels.

Clean rooms are typically designated in accordance with the number of permitted contaminants of a prescribed size per cubic foot of airspace. For example, much semiconductor manufacturing is presently conducted in Class 10 clean rooms, which have filtered air flows to permit no more than ten particles per cubic foot of up to 0.5 $\mu$ in size. Nevertheless, wafers upon which the semiconductor devices are assembled can become contaminated, and therefore rendered defective, by contaminants that are introduced at various process steps. For example, contamination can arise from incomplete cleansing of reagents from the wafer handling apparatus, and the like.

The presence of contaminants can have a catastrophic impact on product yield, notwithstanding an otherwise proper and complete formation of the semiconductor device. Moreover, although the wafers themselves can be properly cleansed of reagents and the like that are used incident to various manufacturing steps, the wafer handling equipment, for a variety of reasons, may not be completely cleansed of the reagents and may therefore serve as a source of wafer contamination for subsequent batches of wafers.

SUMMARY OF THE INVENTION

According to an aspect of the present invention, a system for processing wafers and cleaning wafer-handling implements includes a work cell having a plurality of processing stations for processing wafers, a cleaning station for receiving and delivering wafers to and from a wafer cassette and cleaning a wafer cassette, a transfer mechanism for moving wafers between the plurality of processing stations and the cleaning station. According to an aspect of the invention, the cleaning station may include an exterior door, an exhaust, a housing forming an interior chamber, an interior door, and a plurality of gas nozzles for delivering a cleansing medium over a wafer cassette placed within the interior chamber.

According to another aspect of the present invention, a method for processing wafers and cleaning wafer cassettes is provided that may include the steps of delivering a wafer cassette containing wafers to a first station of a work cell, removing the wafers from the wafer cassette for processing, cleaning the wafer cassette after removal of all the wafers from the wafer cassette. According to an aspect of the invention, the step of cleaning the wafer cassette may include applying a pressurized stream of gas against the surfaces of the wafer cassette.

According to another aspect of the present invention, a method for processing wafers and cleaning a wafer cassette may include the steps of receiving a wafer cassette in a first work station of the work cell, cleaning the wafer cassette, and delivering wafers to the wafer cassette. According to an aspect of the present invention, the step of cleaning the cassette may include delivering a pressurized sweeping gas to the first station to impact the wafer cassette to remove any contaminants.

A technical advantage of the present invention is that it provides for the cleaning of wafer-handling implements while reducing the possibility of omission of cleaning by human operator oversight. Another technical advantage of the present invention is that otherwise idle processing time for a wafer-handling implement may be utilized to clean the implement. Another technical advantage of the present invention is that it may be built into existing loadlocks or work cells to minimize floor space requirements. According to another aspect of the present invention, the labor required for processing wafers and cleaning wafer-handling implements may be reduced.

BRIEF DESCRIPTION OF THE DRAWINGS

For a more complete understanding of the present invention, the objects and advantages thereof, reference is now made to the following descriptions taken in connection with the accompanying drawings in which.

DETAILED DESCRIPTION OF THE INVENTION

The preferred embodiment of the present invention and its advantages are best understood by referring to FIGS. 1 through 6 of the drawings, like numerals being used for like and corresponding parts of the various drawings.

Figure 1:
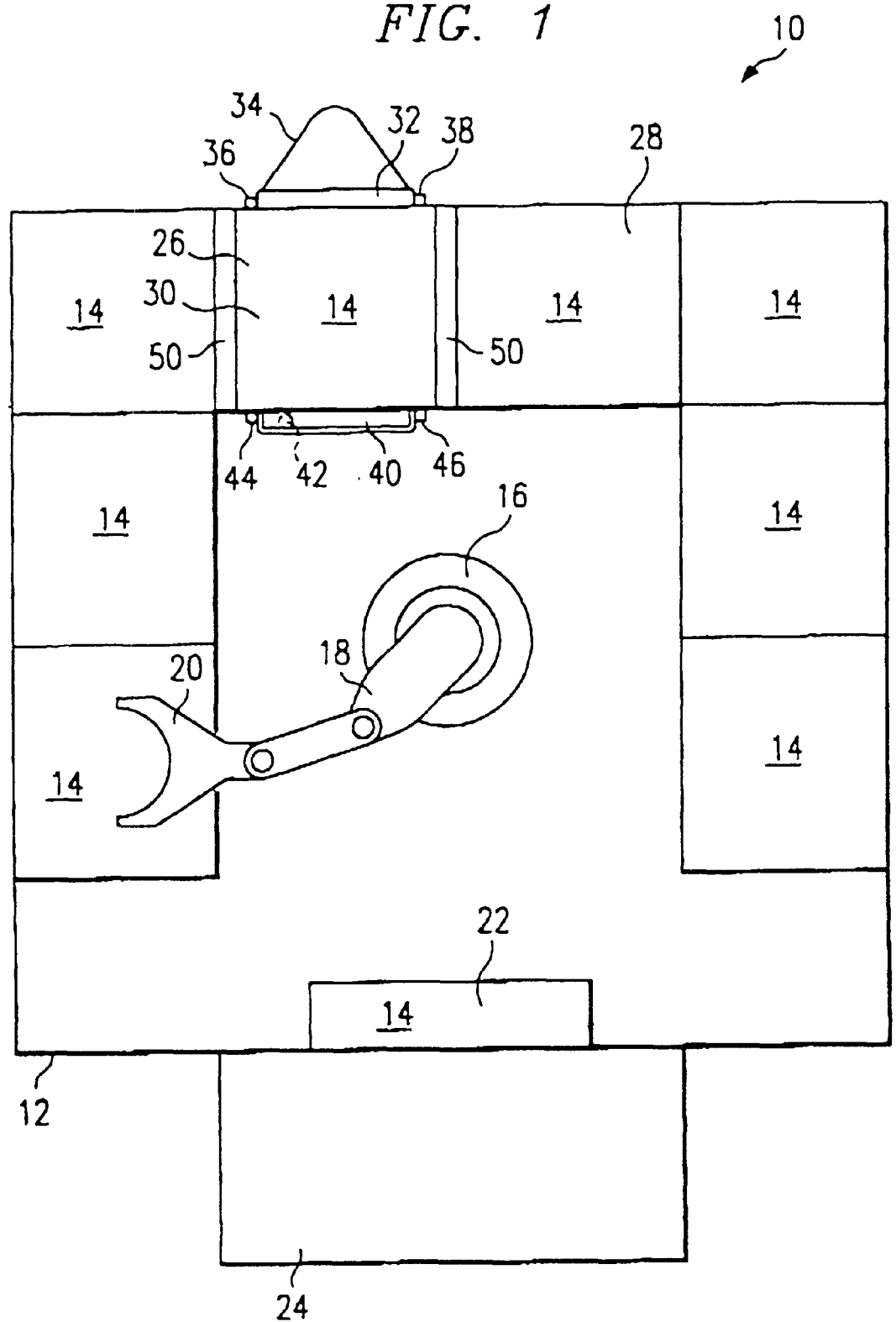
FIG. 1 is a schematic diagram of a system for processing wafers and cleaning wafer-handling implements according to an aspect of the present invention.

Referring to FIG. 1, a system 10 for processing wafers and cleaning wafer-handling implements is shown. System 10 is formed of a work cell or cluster 12 having a plurality of processing stations 14. For illustration purposes, system 10 is presented in the context of a stepper work cell 12. It is to be understood, however, that system 10 may be implemented with a wide variety of other processing cells including other cluster tool processing cells.

Each of the plurality of work stations 14 may be suitable for processing semiconductor wafers in such tasks as receiving and sending wafers to and from a wafer cassette or boat, staging wafers for delivery to a stepper, coating wafers with a resist, developing wafers, baking or chilling wafers, and other processing steps. Wafers may be moved between processing stations 14 by a transport mechanism 16, such as a robot having a robotic arm 18 with a wafer-securing mechanism 20 coupled to one end of robot arm 18. Wafers delivered to processing or a work station 26, which is a stepper interface, may then be handled or processed by stepper 24. One station, station 26, within work cell 12 may be devoted to receiving cassettes with wafers from an exterior of work cell 12 such that in operation, transport mechanism 16 may access individual wafers in a cassette within work station 26. Another station, station 28, may provide a station for delivery of completed or partially completed wafers into a cassette for removal from work cell 12.

Work station 26 is an input/output-and-cleaning station 30. Input/output-and cleaning station 30 has a first door or exterior door 32, which has an exhaust unit 34. Exterior door 32 may be pivotally attached to station 30 with a pivot mount or mechanism 36, and may be held in the closed position by latch 38. Station 30 has a second, or interior, door 40 that has a sweeping gas supply attached to it. Interior door 40 may be pivotally secured by a pivot mount or pivot mechanism 44 and held closed by latch 46. Latch 46 may be a pneumatic or electrical latch that may be remotely controlled, and pivotal mount 44 may have an automated means for opening door 40 remotely as will be further explained below. The transmission of vibration from station 30 to work cell 12 may be prevented by vibration isolation mechanism 50, which may be any of a number of types of dampening devices or isolators and which may be located on all sides of station 30.

Figure 2:
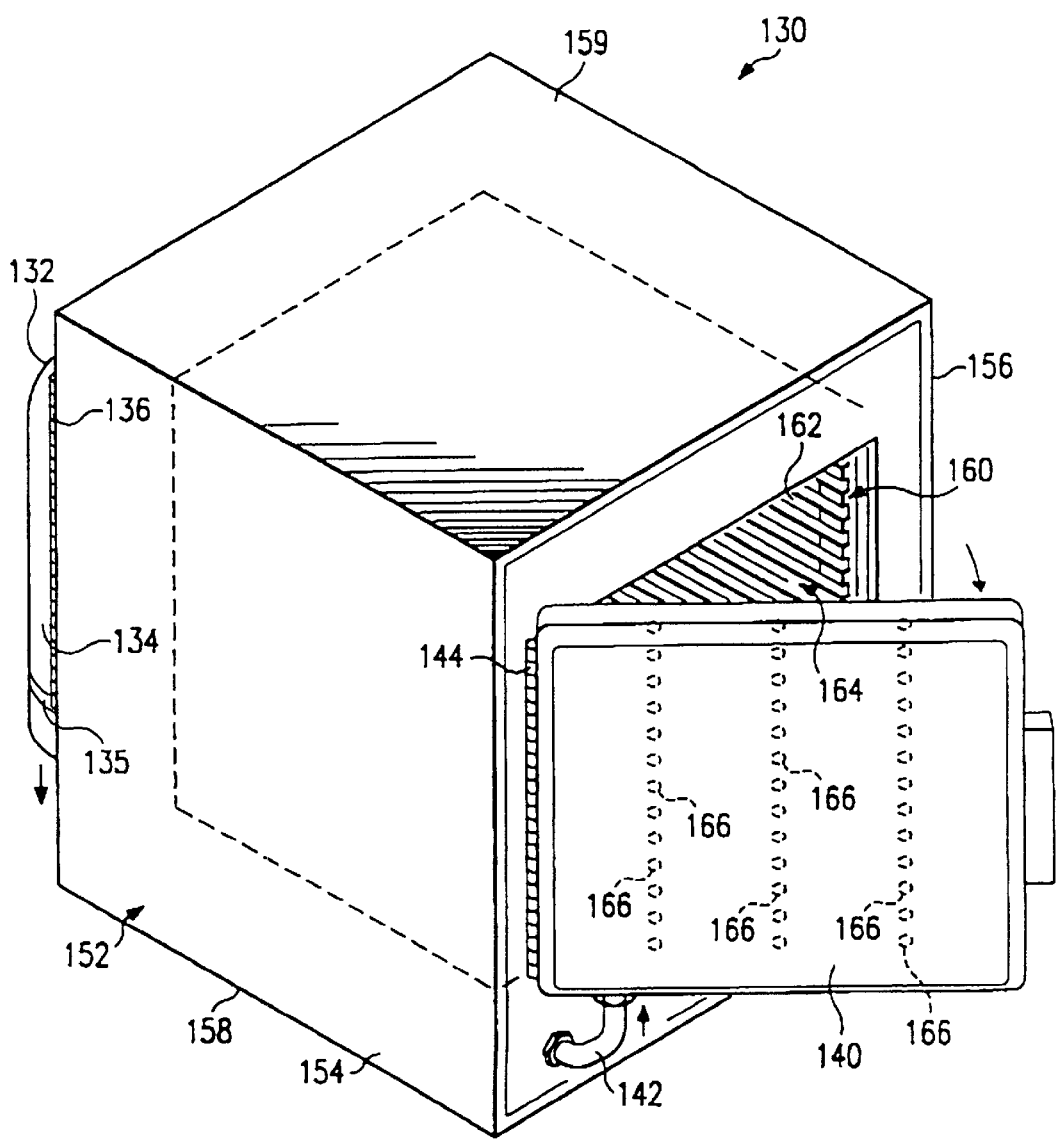
FIG. 2 is a perspective view of one embodiment of an input/output and cleaning station according to an aspect of the present invention.

Referring now to FIG. 2, an input/output-and-cleaning station 130, according to one embodiment, is shown that may be used with system 10. Station 130 has a housing 152, which may be formed with a plurality of panels such as panels 154, 156, and 158. A top surface of panel 158 may hold and secure a wafer cassette or boat 160. Wafer cassette 160 may have a plurality of slots such as slot 162 and corresponding ridges for holding semiconductor wafers.

Interior or back door 140 has a sweeping gas supply 142 that may be used to provide a gas for purposes of cleaning wafer cassette 160 or other wafer-handling implements placed within a chamber 164, which is formed by housing 152. Gas supply 142 may be a flexible hose to accommodate opening and closing of door 140. Cleansing medium (or sweeping gas) supply 142 is capable of delivering a gas, such as nitrogen or another inert gas, to a plurality of jets or nozzles 166. Use of an inert gas as a cleansing medium is preferred so as to avoid interaction between the cleansing medium and the contaminants carried by a cassette. As nitrogen is frequently used in other aspects of semiconductor manufacturing and is available in highly purified concentrations, its use as a cleansing medium or sweeping gas is particularly advantageous for this application. Other appropriate cleansing mediums, however, such as purified, dehydrated air and other fluids that are non-reactive with contaminants that may be present on a cassette can be substituted for the inert gas.

Interior door 140 may be secured to housing 152 by pivot mount or mechanism 144, such as a hinge. When door 140 is in the closed position, nozzles 166 are aligned with slots 162 and/or ridges of wafer cassette 160, such that blasts of sweeping gas delivered to nozzles 166 will impact cassette 160 and slots 162. The sweeping gas delivered from nozzles 166, along with any contaminants released or removed from cassette 160, is delivered to an exhaust 134, which may be on an exterior or front door 132. Door 132 may be formed to receive the gas and contaminants and direct them toward exhaust 134, which may be formed integral with door 132. Door 132 may be held to housing 152 by a pivot mechanism 136.

In operation of station 130, a wafer cassette 160 may be placed into chamber 164 by opening exterior door 132 and inserting cassette 160. Cassette 160 may be held in place within chamber 164 by any of a number of clamping devices. Exterior door 132 may then be closed. Interior door 140 may be opened to allow a transport mechanism, e.g., transport mechanism 16 (FIG. 1), to remove wafers from cassette 160. When all of the wafers have been removed from cassette 160, door 140 may be closed for cleaning. Alternatively, an empty wafer cassette 160 may be placed into chamber 164 through door 132 and cleaning may occur after door 132 is closed, and then processed wafers may be loaded onto cassette 160. As described further below, a processor, may determine that the doors are shut and conditions are correct for continued operation of station 130. An inert gas may then be applied to nozzles 166 to clean cassette 160.

A high-pressure stream of filtered gas, such as nitrogen, may be directed against wafer carrier or cassette 160 to dislodge particles and sweep them into exhaust 134. A short series of gas pulses may be used, such as 20 cycles of ¼ second gas flow with each pulse followed by a pause of ¼ second. Pulsed gas flow may afford faster and more effective cleaning than a continuous operation, since the particle removal is accomplished primarily during the initial gas flow transient. The high-pressure filtered nitrogen may be around 80 psi, and is directed through the plurality of jets or nozzles 166, which are strategically located above the ribs and support members of the wafer carrier 160. The freed particles exit the chamber 164 through the exhaust 134. In order to help optimize the cleaning process, an in situ process monitor (ISPM) may be located in the exhaust 134. The freed particles or contaminants may be monitored if desired using the ISPM 135, which may be a PMS Vaculaz3–4Ch ISPM 135.

Station 130 may be used to clean polypropylene or teflon or fluorosentry or peek wafer carriers or cassees, as well as quartz carriers used in furnace operations. Ionizers may be added to chamber 164 and used to mitigate any electrical charging on electrically conducting wafer carriers 160.

Figure 3:
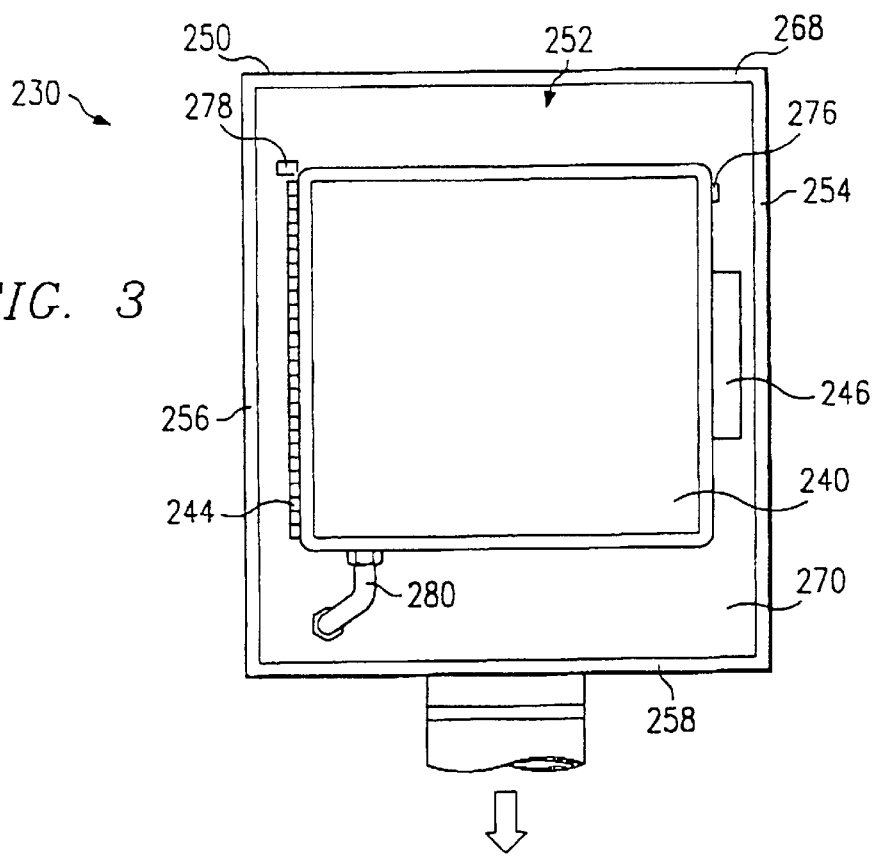
FIG. 3 is an elevational schematic of an input/output and cleaning station according to an aspect of the present invention.
Figure 4:
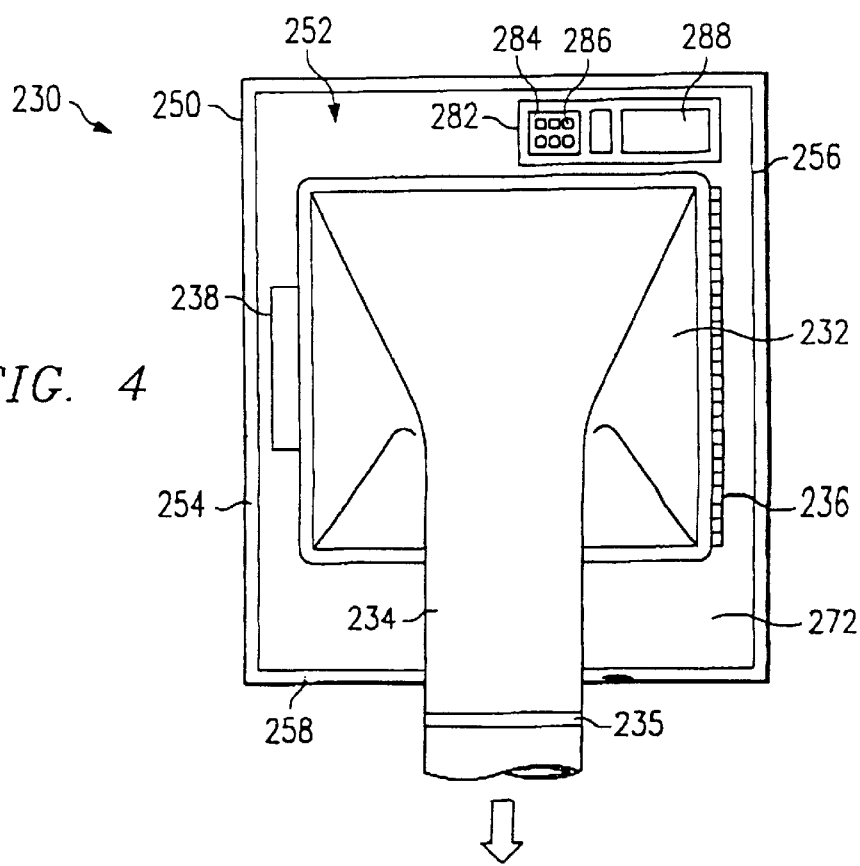
FIG. 4 is an elevational schematic of the input/output and cleaning station of FIG. 3 from a view opposite that shown in FIG. 3.
Figure 5:
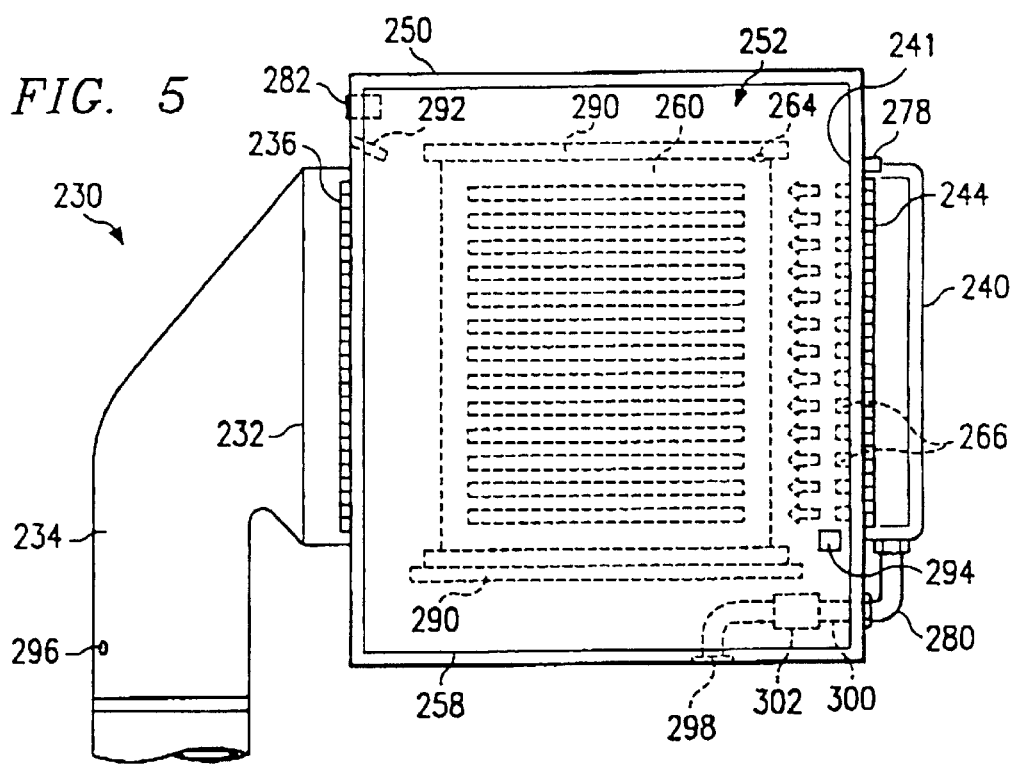
FIG. 5 is an elevational schematic side view of the input/output and cleaning station of FIGS. 3 and 4.

Referring now to FIGS. 3–5, another embodiment of an input/output-and-cleaning station 230 is shown. Station 230 is suitable for use with system 10 of FIG. 1.

Station 230 has a housing 252. Housing 252 may be formed with a top panel 268, a bottom panel 258, panels 254 and 256, and panels 270 and 272. Housing 252 forms an interior chamber, or cavity, 264 (FIG. 5). Panels 254, 256, 270, 272 may be formed from electro-polished stainless steel, such as 304- or 316-grade stainless steel to facilitate the separation or removal of contaminants from within chamber 264. Formation of these surfaces in this manner renders a hardened, flat surface that is substantially devoid of surface irregularities, thereby facilitating the passage of dislodged contaminants therealong incident to the cleansing process. The interior side panels or walls of the cleaning chamber 264 can optionally be provided with curvilinear surfaces, as opposed to planar surfaces.

The chamber 264 is preferably sloped and formed to facilitate conveyance of a dislodged contaminants from the processing chamber and cassette into the exhaust stack of the manufacturing facility through exhaust 234. Baffling may be added to chamber 264.

Housing 252 may be surrounded about a periphery with vibration isolation mechanisms 250. Vibration isolation mechanisms 250 are to help assure that any vibrations induced in station 230 are not transmitted to other portions of a work cell, such as work cell 12, and into a stepper, such as stepper 24, or other equipment. Station 230 includes a first or exterior door 232 and a second or interior door 240.

Referring now to FIG. 3, door 240 may be held to panel 270 of housing 252 by a pivot mechanism 244 and, when in the closed position, by sealing latch 246. Sealing latch 246 may be automated to promote locking and release of door 240. A sensor 276, such as a proximity sensor or by contact sensor may be placed adjacent to door 240 such that sensor 276 may sense when door 240 is closed. A door opening and closing mechanism 278, which may be, for example, a motor, allows for remote opening and closing of door 240. A flexible hose 280 may be used to supply a cleansing medium or sweeping gas to interior door 240 and into a plurality of jets or nozzles 266 (FIG. 5).

With reference to FIG. 5, nozzles 266 are secured or otherwise mounted along an inner surface 241 of door or lid 240 and are operable to deliver a pressurized stream of cleansing medium or gas through nozzles 266 to a wafer cassette 260 or other handling implement received within chamber 264. One or more of the nozzles 266 can optionally be arranged to direct a cleansing medium or gas stream that is angled with respect to the cleansing medium or gas streams emitted by the remaining nozzles. One or more of the nozzles 266 can instead be coupled to a supply of a suitable deionizing medium to deliver a deionizing medium to chamber 264. The nozzles 266 can be repositioned along the surface 241 of door 240 in an appropriate manner in accordance with such factors as the dimensions and configurations of the cleaning cassette 260 to be cleansed, the composition of the cassette 260, the desired cleansing medium spray pattern, and the like. Supplemental access to chamber 264 may be provided for maintenance and other reasons.

Referring now to FIG. 4, first door or exterior door 232 may be held to panel 272 by a pivot mechanism 236 and when in the closed position by a latch 238. Door 232 has an exhaust portion 234. Exhaust 234 is typically continuously operable as in many semiconductor manufacturing facilities and generally exhibits flow rates of between 25 and 1000 CFM. It is to be appreciated that the connection to exhaust 234 creates a negative pressure within the processing chamber 264 which, in and of itself, tends to draw dislodged contaminants away from cassette 260 and into exhaust 234. Depending on the negative pressure generated by or applied to exhaust 234, it may be desirable in some instances to provide an optional vent on one of the panel walls. Door 232 and exhaust 234 are formed to have smooth rounded surfaces to facilitate the exhausting of contaminants that may be removed from wafer cassette 260 (FIG. 5).

An in situ particle monitor or residual gas analyzer 235 can be coupled to the exhaust 234 to provide feedback via a lead in an appropriate manner regarding the level of contaminants in the fluid flow evacuated from the processing chamber 264. The process or particle monitor 235 may be applied in exhaust 234 during the setup process to confirm optimized performance of station 230, after which, the particle monitor may be replaced by a plug device that may be optionally removed to restore the particle monitor 235 for periodic checking of station 230.

A control unit or panel 282 may be located on panel 272. Control panel 282 may include a keypad 284, power selector 286, a display 288, and other devices. Control panel 282 is provided on panel 272 to permit for the entry of various user inputs and to display various types of information relating to various aspects of station 230 operation.

The control unit 282 may include visible indicia of system readiness, such as a power light, which confirms placement of a power switch 286 in an appropriate position, such as an "on" or "standby" position. Control unit 282 may automatically control the preparation and performance of the cleaning cycle and may be slaved to an overall process controller to remain coordinated with the process flow. Alternatively, manual process control may be accomplished through a control unit 282. A processing cycle of prescribed time duration can be initiated by appropriate manipulation of start selector on key pad 284. If desired, a cycle reset selector on key pad 284 can be manipulated in an appropriate manner to manually ready the station 230 for commencement of a new processing cycle. A digital processor associated with control panel 282 monitors various parameters to inhibit system operation in instances where prescribed conditions are not satisfied. Such parameters may include, by way of non-limiting example, cleansing medium supply line pressure 298 and exhaust 234 vacuum pressure, one or more of which can be displayed in an appropriate manner on control panel 282. Reference is made to U.S. Pat. No. 5,551,165, assigned to Texas Instruments Incorporated, which is incorporated herein for all purposes.

Control panel 282 can be in the form of a reconfigurable commercial-grade operator interface unit, such as Nemnatron Series 200 C PLC Graphics Workstation, manufactured by Nematron Corporation of Ann Arbor, Mich., or other control unit. Control panel or control unit 282 can be electrically coupled to processors associated with work cell 12 (FIG. 1) and with other workstations within work cell 12 for coordinated operation of station 230.

Referring again to FIG. 5, wafer cassette 260 is shown in hidden lines in chamber 264 of station 230. A mounting device 290 may be included within chamber 264 to secure wafer cassette 260. Mounting device 290 may be associated with a pivot to allow cassette 260 to be inverted for unloading or loading in some devices. See, e.g., 512 in FIG. 6. When quartz cassettes are to be cleansed, mounting mechanism 290 is preferably formed from various resins or polytetrafluoroethylenes ("PTFEs") to avoid reaction with, or retention of, contaminants introduced into the processing chamber 264 by the cassette 260 to be cleansed. Other materials may be used for mechanism 290, but metal should typically be avoided because it may decrease carrier lifetime of the wafers placed therein. When polypropylene and other non-quartz implements are to be cleansed, mounting mechanism 290 can be formed from an electro-polished stainless steel, such as 304- or 316-grade stainless steel.

The cleaning operation carried out by station 230 may be performed once wafers are removed from cassette 260, and sensors 292 and 294, which may be secured in an interior portion, confirm the absence of wafers in cassette 260. As noted elsewhere, the cleaning operation may also be carried out by station 230 when an empty wafer cassette 260 is placed within station 230 without any wafers in cassette 260, and then cassette 260 may be loaded after cleaning. Information developed by sensors 292, 294 may be delivered to control panel or unit 282, which may include a microprocessor for carrying out processing steps such as only allowing unit 230 to enter a cleaning cycle when the absence of wafers is confirmed by the sensors 292 and 294. In this same regard, a sensor 296 may be included to confirm that a vacuum is being applied on exhaust 234 before a processor within control unit or panel 282 allows the cleaning cycle to start. Also, sensor 276 on interior door 240 may confirm that the door is shut before control unit 282 will allow the cleaning operation to begin.

A portion of housing 252 has a gas inlet 298 coupled to an internal conduit 300 for delivery to hose 280 and door 240. A control valve or solenoid 302 is provided on internal conduit 300. Flow of the cleansing medium in conduit 300 is thus regulated by an appropriate flow control device, such as solenoid 302 or other precision valving device. Valve 302 may be coupled to control unit or panel 282 such that release of sweeping gas to nozzles 266 may only occur during prescribed conditions, as previously discussed. A pressurized flow of cleansing medium or sweeping gas is supplied to the chamber 264 from an associated supply tank or by means of a supply line inlet 298 that is connected to a facility reservoir. As discussed previously in connection with other embodiments, the cleansing medium is preferably in the form of a pressurized gaseous flow.

Figure 6:
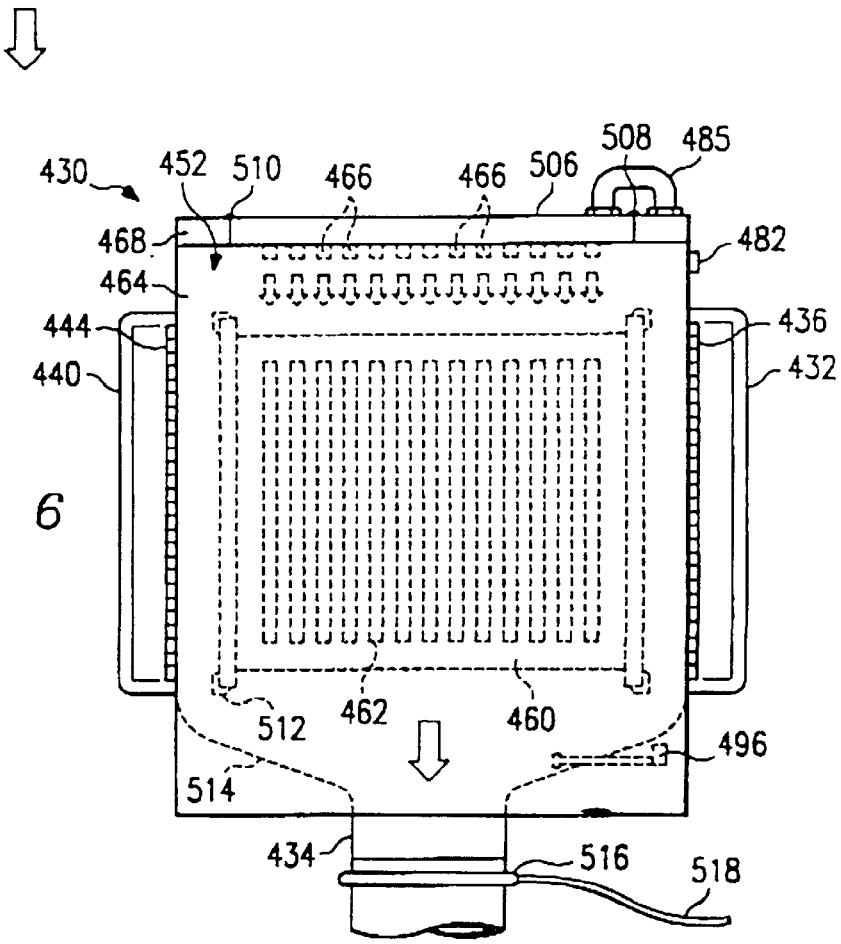
FIG. 6 is an elevational schematic of another input/output and cleaning station according to an aspect of the present invention.

Referring now to FIG. 6, an input/output-and-cleaning station 430 is shown that is suitable for use with system 10 of FIG. 1. Station 430 has a first or exterior door 432 held to a housing 452 by pivoting mechanism 436. Station 430 also has an interior door, or second door 440, which is held to housing 452 by hinge mechanism 444. On a top panel 468, which constitutes a portion of housing 452, a nozzle panel or door 506 is attached. Panel 506 may be held to housing 452 by pivot mechanism 508, and when closed, by latch 510. Panel or door 506 has a plurality of nozzles or jets 466 for delivering a sweeping gas into the main chamber or cavity 464 formed by housing 452. A hose 485 may be used to provide sweeping gas to panel 506 and nozzles 466. Hose 485 may receive the sweep gas from an internal conduit.

A cassette clamping mechanism 512 is provided in chamber 464 for holding cassette 460 and allowing cassette 460 to be rotated at least 90 degrees. Thus, wafer cassette 460 may be introduced into chamber 464 through exterior door 432 and individual wafers removed through door 440 in a manner analogous to that previously discussed. Once all the wafers are removed from cassette 460, the clamping mechanism 512 may rotate cassette 460 such that slots 462 and associated ribs of cassette 460 are parallel with the local field of gravity and with the gas flow as introduced from nozzles 466. The rotation will typically be 90 degrees. The pulsed sweeping gas passes from nozzles 466 across cassette 460 and is directed by baffling 514 to exhaust 434. Exhaust 434 may include an in situ particle monitor 516, having lead 518. Exhaust 434 may also include a sensor 496 for providing information to a control unit 482 concerning vacuum or pressure level within exhaust 434. Other features and methods are analogous to those presented above.

In another alternative embodiment, the cassette containing wafers may be placed in a receiving area until all of the wafers are removed from the cassette, and then the cassette carrier may be moved into a cleaning chamber of the station by a glide or, an empty wafer cassette may be placed in a receiving area and then moved into a cleaning chamber of the station by a glide for cleaning and then returned for loading with wafers. In the cleaning chamber, the cassette may be cleaned with a pulsed sweeping gas in a manner analogous to that described above. Reference is made to U.S. Pat. No. 4,636,128, entitled Semiconductor Slice Cassette Transport Unit, assigned to Texas Instruments Incorporated, which is incorporated herein for all purposes.

Although the invention has been particularly shown and described by the foregoing detailed description, it will be understood by those skilled in the art that various other changes in form and detail may be made without departing from the spirit and scope of the invention, which is defined by the appended claims. For example, the station used for cleaning wafer cassettes presented has been an input/output-and-cleaning station 30, 130, 230, and 430, but other stations 14 may have the cleaning aspect incorporated therein.

What is claimed is:

1. A system for processing wafers and cleaning wafer cassettes comprising a work cell wherein the work cell comprises:

a plurality of processing stations for processing wafers;

a cleaning station for receiving and delivering wafers to and from a wafer cassette and for cleaning a wafer cassette;

a transfer mechanism for moving wafers between the plurality of processing stations and the cleaning station; and wherein the cleaning station comprises:
a housing forming an interior chamber,
an exterior door forming a portion of the housing for providing access to the interior chamber,
an exhaust formed on a portion of the housing,
an interior door forming a portion of the housing for providing access to the interior chamber, and
a plurality of gas nozzles attached to a portion of the housing for delivering a sweeping gas to the interior chamber and over a wafer cassette placed within the interior chamber and to the exhaust for removal from the interior chamber.

2. The system of claim 1 wherein the exhaust is coupled to the exterior door and the plurality of nozzles are coupled to the interior door.

3. The system of claim 1 wherein the plurality of nozzles are coupled to the exterior door and the exhaust is coupled to the interior door.

4. The system of claim 1 wherein the plurality of nozzles are coupled to the exterior door.

5. The system of claim 1 further comprising an in situ particle monitor coupled to the exhaust.

6. The system of claim 1 further comprising a first remotely-controlled latch associated with the interior door for selectively opening and closing the interior door.

7. The system of claim 1 further comprising a first remotely-controlled latch associated with the interior door for selectively opening and closing the interior door;

a second remotely-controlled latch associated with the exterior door for selectively opening and closing the exterior door;

a flow control device fluidly coupled to the plurality of nozzles for controlling gas flow therein; and a control unit coupled to the flow control device for controlling gas flow to the plurality of nozzles to provide a pulsed flow.

* * * * *